United States Patent [19]

Fenwick et al.

[11] Patent Number: 4,479,041

[45] Date of Patent: Oct. 23, 1984

[54] PNEUMATIC BALL CONTACT SWITCH

[75] Inventors: Danny L. Fenwick, Springdale, Ohio; Jon D. Hopkins, Unionville, Conn.

[73] Assignee: General Electric Company, Cincinnati, Ohio

[21] Appl. No.: 443,826

[22] Filed: Nov. 22, 1982

[51] Int. Cl.$^3$ .............................................. H10H 35/24

[52] U.S. Cl. .......................... 200/81 R; 200/DIG. 29

[58] Field of Search ................ 200/81 R, 81 H, 89 R, 200/81.9 R, DIG. 29, DIG. 43

[56] References Cited

U.S. PATENT DOCUMENTS

| | | | |
|---|---|---|---|
| 1,341,267 | 5/1920 | East | 200/DIG. 29 |
| 2,208,884 | 7/1940 | Herbster | 200/81.9 R |
| 2,855,473 | 10/1958 | Rabinow | 200/17 R |
| 2,875,291 | 2/1959 | Armstrong et al. | 200/81 |
| 3,526,723 | 9/1970 | Thomson | 200/DIG. 43 |
| 3,823,285 | 7/1974 | Dwyer | 200/81 H |
| 4,087,706 | 5/1978 | Koester | 200/84 R |

OTHER PUBLICATIONS

Hawley, Condensed Chemical Dictionary, 1977 9th Ed., pp. 31, 205, 420, 530, 765, 816, Van Nostrand Reinhold Pub.

Brady, Materials Handbook, 1963, 9th Ed. McGraw-Hill Pub., pp. 510, 635, 660, 723.

*Primary Examiner*—George H. Miller, Jr.
*Assistant Examiner*—M. Reinhart
*Attorney, Agent, or Firm*—Gregory A. Welte; Derek P. Lawrence

[57] ABSTRACT

A switch is disclosed having a plurality of conductors entering a chamber containing a movable contact element. Air pressure applied to the contact element moves it into contact with at least one of the conductors.

4 Claims, 3 Drawing Figures

PNEUMATIC BALL CONTACT SWITCH

The invention relates to electrical switches and, more particularly, to switches of this type which utilize a freely movable contact element contained within a chamber to close the circuit between two conductors when moved into contact therewith.

BACKGROUND OF THE INVENTION

It is sometimes necessary to remotely connect and disconnect electrical conductors contained in a high temperature environment in a region subject to high centrifugal forces. As an example, in a gas turbine engine, temperatures can exceed 1000° F. and rotating components can experience centrifugal forces of the order of 10,000 g's. In such an environment, the high temperature makes the use of solid state electronics unfeasible, and the high centrifugal forces make the use of mechanical relays difficult. In addition, the space available inside such engines requires that any switches contained therein be of minimal size, particularly in the case where numerous switches are sought to be located therein.

OBJECTS OF THE INVENTION

It is an object of the present invention to provide a new and improved electrical switch.

It is a further object of the present invention to provide a new and improved electrical switch which is remotely operable and tolerant to high temperatures.

It is a further object of the present invention to provide a new and improved pneumatically operable electrical switch which is capable of functioning in a large centrifugal force field.

SUMMARY OF THE INVENTION

In one form of the invention, a contact element is contained within a chamber. An air passage communicates with the chamber so that when air pressure is applied to the passage, the contact element is forced into contact with two conductors extending into the chamber, thereby establishing electrical contact between them.

DETAILED DESCRIPTION OF THE INVENTION

Figure 1:
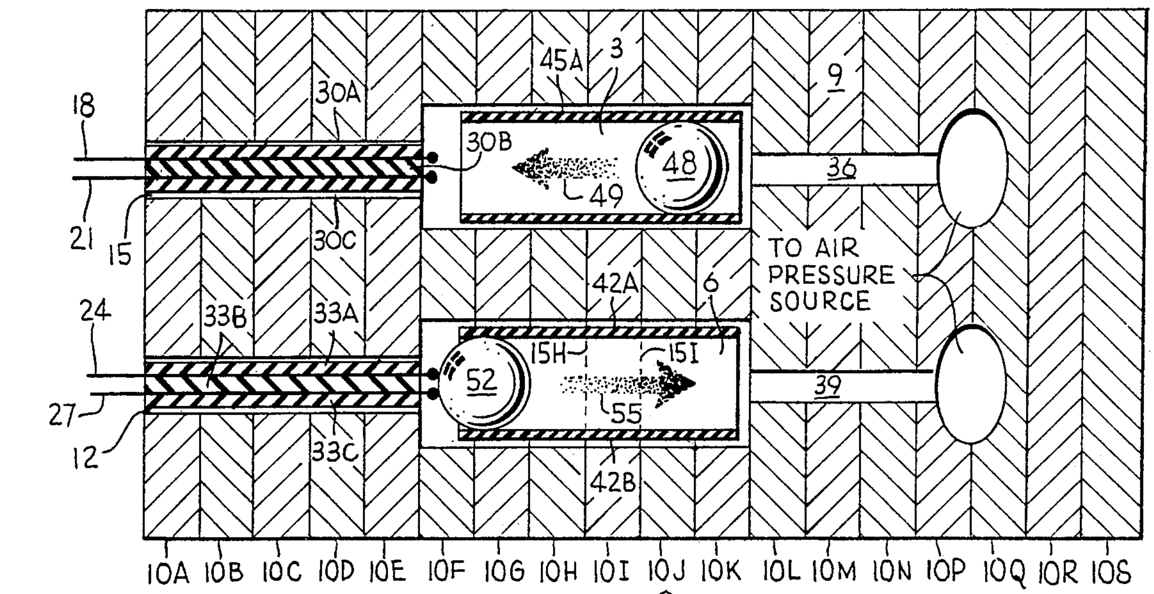
FIG. 1 illustrates a cross-sectional view of one form of the present invention.

One form of the invention is shown in FIG. 1 wherein two chambers, 3 and 6, are shown contained within a housing 9. The housing 9 is composed of a plurality of metallic lamina 10A–S, each containing a pair of perforations. One pair of perforations is shown as dotted lines 15H and 15I. When the lamina 10A–S are stacked and the perforations such as 15H–I properly aligned, two groups of perforations, namely those in lamina 10F–K, will respectively form the two chambers 3 and 6. By a similar arrangement of properly spaced perforations in the lamina 10A–E, two first passages 12 and 15, are provided in the housing 9. This stacking and alignment is further illustrated in FIG. 2 in which some of the lamina, namely lamina 10C–10I, are shown in exploded form. The perforations 15C–E and 3F–I, as well as perforations 12C–E and 6F–I are aligned along respective axes 11A and 11B. When the lamina 10C–I are stacked, the perforations in adjacent lamina will form a chamber or passage within the stack. In this example, perforations 15C–E form part of passage 15 and perforations 3F–I (of different size than perforations 15C–E) form part of chamber 3. The stacked lamina are held in place by suitable means such as by bolting, diffusion bonding or welding.

The passages 12 and 15 each contain two electrical conductors (a total of four conductors), namely conductors 18, 21, 24 and 27. Conductors 18 and 21 extend into chamber 3 and conductors 24 and 27 extend into chamber 6. These conductors are insulated from each other as well as from the housing 9 by insulators 30A–C and 33A–C. The cross-sectional shape of these insulators can resemble the figure-eight cross-sectional configuraion of common household wiring. Two second air passages 36 and 39 are formed within the housing 9 by similarly aligning perforations in the lamina 10L–Q. The air passages 36 and 39 lead to sources of pneumatic pressure (not shown).

The inner surface or wall such as wall 33A of each chamber 3 and 6, is coated or layered with respective electrical insulators, 42A–B and 45A–B, which are preferably cylinders of sapphire if the chambers 3 and 6 are themselves cylindrical. Each chamber, 3 and 6 respectively, contains a freely movable contact element such as conducting spheres 48 and 52. Application of air pressure to second passage 36 will apply a force to conducting sphere 48 in the direction of arrow 49, pushing sphere 48 into contact with the two conductors 18 and 21, thereby closing the circuit between them. The air displaced by the motion of the sphere 48 is vented through passage 15 or through another passage (not shown). Sphere 52 would be activated in an analogous manner. Application of air pressure to first passage 12 will cause the conducting sphere 52 to move in the direction of arrow 55, thereby breaking contact with conductors 24 and 27 and opening the circuit between them. The air displaced by the motion of the sphere 52 is vented through air passage 39 or through another passage (not shown). The contact of sphere 48 with conductors 18 and 21 would be broken in an analogous manner.

Figure 2:
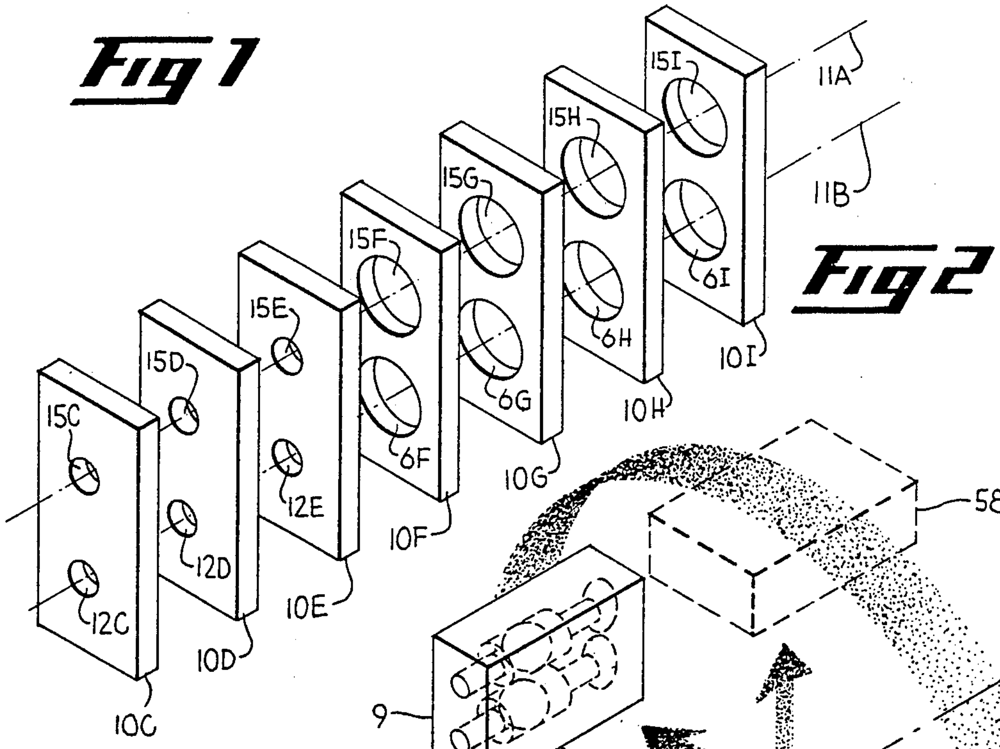
FIG. 2 illustrates an exploded view of part of the present invention.

The lamina comprising the housing 9 are preferably composed of stainless steel or an alloy of nickel and chromium and are preferably 0.005 in. (0.013 cm) thick each. The chambers 3 and 6 are preferably cylindrical (that is, the perforations such as 15H in FIG. 2 are circular, thus providing the chambers 3 and 6 with circular walls), 0.10 in. (0.254 cm) in diameter and 0.3 in. (0.762 cm) long. The insulators 42A–B and 45A–B which line these chambers can be constructed of a material which can sustain high temperatures such as cylinders of sapphire. The conductors 18, 21, 24 and 27 can be composed of a high temperature conducting material such as Alumel or Chromel and the insulators 30A–C and 33A–C can be composed of magnesium oxide. The spheres 48 and 52 can be a solid metal, such as steel ball bearings, but, as will be described below, operation of the switch in a large centrifugal force field can require forces of enormous magnitude to move such relatively heavy spheres. Consequently, a relatively light, hollow, glass sphere having a metallic coating such as sputtered gold is preferred. The diameter of the sphere is preferably 0.10 in. (0.254 cm) and its hollow interior is preferably about 0.090 in. (0.229 cm) in diameter. The diameter of the insulator 42A–B is preferably about 0.003 in. (0.0076 cm) larger than that of the sphere 52 so that the air applied to the inlet passage 39 will force the sphere 52 to move, rather than merely flow between the sphere 52 and the insulator 42A–B. Further, the similar diameters of the insulator 42A–B and the sphere 52 (differing by 0.003 in. as mentioned) results in the sphere's contacting the insulator 42A–B along the surface of the sphere 52 when it is centrifugally forced into the insulator 42A–B, rather than at just one point as the sphere 52 would if the insulator 42A–B were flat. Thus, the force exerted by the sphere 52 against the insulator 42A–B is distributed and not located at one point. Accordingly, the compression of the insulator 42A–B is less and the rolling resistance of the sphere 52 is less than if the insulator 42A–B were flat.

Figure 3:
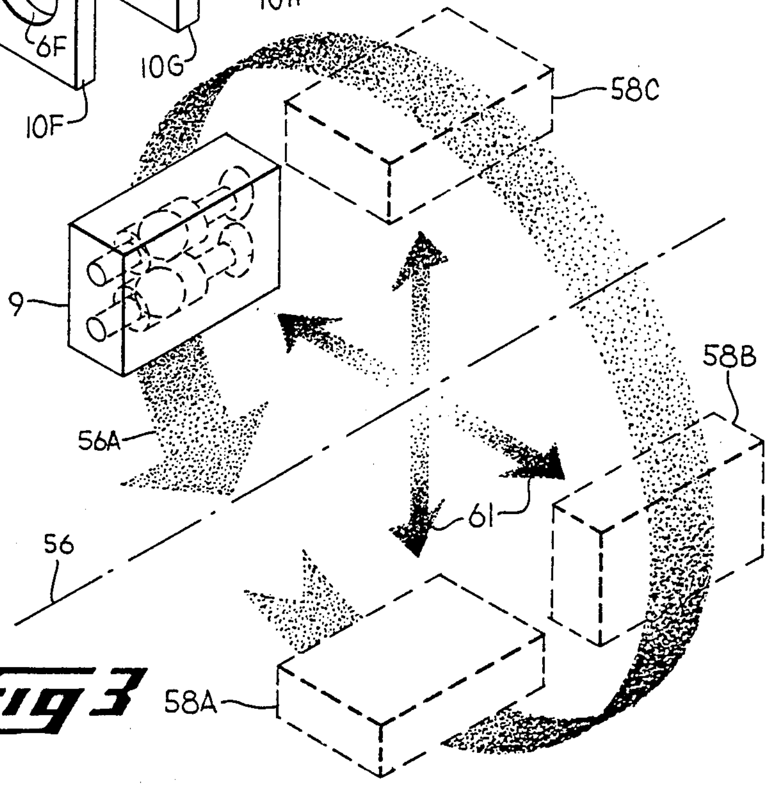
FIG. 3 illustrates rotational motion experienced by one form of the present invention.

The housing 9 can be supported on a rotating device such as a gas turbine engine rotor, and, as shown in FIG. 3, the housing 9 can rotate about an axis 56 in the direction of arrow 56A and assume successive positions as shown in the phantom outlines 58A–C. The housing 9, as well as the components contained therein, will experience centrifugal force in the radial direction, that is, a force in the direction of arrows 61. This force can be quite large. For example, at 10,000 rpm a rotating object located six inches away from the axis of rotation experiences a centrifugal force of about 17,000 g's. Thus, it is important that the path traveled by spheres 48 and 52 be parallel to the axis of rotation. That is, the arrows 49 and 55 in FIG. 1 representing these paths should be parallel to the axis of rotation. Otherwise, the spheres will travel uphill and downhill with respect to the centrifugal force 61 as they move. Further, even if the paths of the spheres 48 and 52 are parallel to the axis of rotation 55, the large centrifugal force will compress sphere 48 against insulator 45A, thus slightly flattening sphere 48 and slightly denting insulator 45A. This flattening causes sphere 48 to encounter rolling resistance in moving, and this resistance will be greater, the greater the weight of the sphere 48. Thus, a light, hollow sphere is preferred.

The source of the air pressure applied to air passages 36 and 39 is not shown in FIG. 1, but the air pressure can be derived from a pneumatic switching network such as the one disclosed in the patent application by Danny L. Fenwick and Charles M. Stanforth, Ser. No. 443,825, entitled "Pneumatic Signal Multiplexer," which is concurrently filed herewith, assigned to a common assignee, and hereby incorporated by reference. The description of a switch disclosed in the patent application by Paul M. Clark, Danny L. Fenwick and Jon D. Hopkins, Ser. No. 443,827, entitled, "Pneumatic Reed Switch," which is concurrently filed herewith and assigned to a common assignee is also hereby incorporated by refernce.

A switch has been disclosed which can be utilized in a high temperature environment subject to high centrifugal forces. The dimensions given herein allow construction of a switch of small size for use in a compact space such as within a gas turbine engine.

While one embodiment of the present invention has been described it will be obvious to those skilled in the art that numerous modifications and substitutions can be undertaken without departing from the true spirit and scope of the present invention. Accordingly, what is desired to be secured by Letters Patent is the invention as defined in the following claims.

We claim:

1. A pneumatically operated electrical switch, comprising:
(a) a stack of metallic lamina containing a cylindrical chamber and diffusion bonded together and rotatable about an axis such that the cylinder is parallel with the axis and such that the cylinder is subject to a centrifugal acceleration exceeding 10,000 g's,
(b) two metallic conductors penetrating the chamber,
(c) insulating means for electrically insulating the conductors,
(d) a cylindrical insulator comprising sapphire and contained within the cylindrical chamber for electrically insulating the sphere from the stack of lamina,
(e) a first fluid passage communicting with the chamber for admitting fluid pressure to urge the sphere into contact with the conductors, and
(f) a second fluid passage communicating with the chamber for admitting fluid pressure to disconnect the sphere from the conductors, and
(g) a movable, hollow glass sphere which
  (i) has a conductive coating,
  (ii) is contained within the cylindrical insulator of (e) and
  (iii) can be rolled along the cylindrical insulator by application of fluid pressure of (e) during the rotation of (a).

2. A switch according to claim 1 in which some of the lamina have at least one dimension of 0.005 in.

3. A switch according to claim 1 in which the insulator of (e) comprises a sleeve comprising sapphire.

4. An electrical switching system, comprising:
(a) a housing containing an elongated, cylindrical chamber and heated to a temperature exceeding 700° F.;
(b) two metallic conductors penetrating the chamber;
(c) a movable, hollow, glass sphere having a gold-containing coating;
(d) a cylindrical, insulating sleeve contained within the chamber for electrically insulating the glass sphere from the housing and for defining a path along which the glass sphere can roll;
(e) a first fluid passage communicating with the chamber for admitting fluid pressure to urge the sphere into contact with the conductors;
(f) a second fluid passage communicating with the chamber for admitting fluid pressure to disconnect the sphere from the conductors; and
(g) means for rotating the housing about an axis such that the path of (d) is substantially parallel to the axis and such that the centrifugal acceleration within the chamber exceeds 10,000 g's;

wherein the sphere is compressed against the surface of the sleeve and wherein the insulating sleeve is deformed about the sphere, thus increasing the rolling resistance of the sphere, and wherein the path of (d) travels neither uphill nor downhill with respect to the centrifugal acceleration of (g).

* * * * *